United States Patent
Mazzillo et al.

(10) Patent No.: US 9,685,575 B2
(45) Date of Patent: Jun. 20, 2017

(54) MULTIBAND DOUBLE JUNCTION PHOTODIODE AND RELATED MANUFACTURING PROCESS

(71) Applicant: STMICROELECTRONICS S.R.L., Agrate Brianza (IT)

(72) Inventors: Massimo Cataldo Mazzillo, Corato (IT); Antonella Sciuto, Giarre (IT); Dario Sutera, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 153 days.

(21) Appl. No.: 14/640,663

(22) Filed: Mar. 6, 2015

(65) Prior Publication Data

US 2016/0260861 A1 Sep. 8, 2016

(51) Int. Cl.
*H01L 31/101* (2006.01)
*H01L 31/108* (2006.01)

(52) U.S. Cl.
CPC ........ *H01L 31/1013* (2013.01); *H01L 31/108* (2013.01)

(58) Field of Classification Search
CPC .......................... H01L 31/108; H01L 31/1013
USPC .......................................................... 257/184
See application file for complete search history.

(56) References Cited

U.S. PATENT DOCUMENTS

| 3,924,150 | A * | 12/1975 | Wasa | ................. | H04B 10/6911 |
| | | | | | 257/184 |
| 6,049,116 | A | 4/2000 | Park et al. | | |
| 2004/0108461 | A1 | 6/2004 | Mitra | | |
| 2009/0159785 | A1 | 6/2009 | Tsang | | |
| 2009/0189207 | A1 | 7/2009 | Dutta | | |
| 2010/0264505 | A1 * | 10/2010 | Bui | .................... | H01L 27/14601 |
| | | | | | 257/437 |
| 2010/0301445 | A1 * | 12/2010 | Mazzillo | ........... | H01L 31/03529 |
| | | | | | 257/450 |
| 2011/0175188 | A1 * | 7/2011 | Bui | ................. | H01L 31/035281 |
| | | | | | 257/443 |

OTHER PUBLICATIONS

Korona et al., "Multiband GaN/AlGaN UV Photodetector," Proceedings of the XXXV International School of Semiconducting Compounds, Jaszowiec, *Acta Physica Polonica A* 110(2):211-217, 2006.
Korona et al., "Tuning of Spectral Sensitivity of AlGaN/GaN UV Detector," Proceedings of the XXXII International School of Semiconducting Compounds, Jaszowiec, *Acta Physica Polonica A* 103(6):675-681, 2003.
Zizak, "Flame Emission Spectroscopy: Fundamentals and Applications," ICS Training Course on Laser Diagnostics of Combustion Processes, NILES, University of Cairo, Egypt, Nov. 18-22, 2000, 29 pages.

* cited by examiner

*Primary Examiner* — Yasser A Abdelaziez
(74) *Attorney, Agent, or Firm* — Seed IP Law Group LLP

(57) ABSTRACT

A photodiode structure is based on the use of a double junction sensitive to different wavelength bands based on a magnitude of a reverse bias applied to the photodiode. The monolithic integration of a sensor with double functionality in a single chip allows realization of a low cost ultra-compact sensing element in a single packaging useful in many applications which require simultaneous or spatially synchronized detection of optical photons in different spectral regions.

14 Claims, 16 Drawing Sheets

MULTIBAND DOUBLE JUNCTION PHOTODIODE AND RELATED MANUFACTURING PROCESS

BACKGROUND

Technical Field

The present disclosure relates to photodiodes and particularly to monolithic photodetectors sensitive to radiation in at least two different wavelength bands ranging from ultraviolet to infrared.

Description of the Related Art

Photodiodes are semiconductor devices that contain a P-N junction, and often an intrinsic (undoped) layer between n and p layers. Devices with an intrinsic layer are called P-i-N photodiodes. Alternatively, a Schottky photodiode uses a metal-semiconductor junction as a Schottky junction rather than a semiconductor-semiconductor junction as in conventional photodiodes. Light absorbed in depletion regions or the intrinsic region in P-i-N photodiodes generates electron-hole pairs, most of which contribute to a photocurrent. Conventional photodiodes operate in different regions of the electromagnetic radiation spectrum. The particular semiconductor materials that make up the photodiode determine the particular wavelength or wavelength range of the radiation to which the photodiode responds. Photodiodes can be fabricated from elemental semiconductors, such as silicon, as well as compound semiconductors, such as gallium-arsenide, gallium nitride, or silicon carbide.

Broadband photodetectors having detection capabilities ranging from ultraviolet to near infrared can be useful in many applications such as data transport and storage in optical communications. Moreover there are several applications, mainly in military and industrial domains, which aspire to simultaneous or spatially synchronized detection of optical photons in different spectral regions. Photons emitted by fires, jet or rocket nozzles or stellar luminaries for example have typical wavelengths ranging from ultraviolet to infrared. All these emissions are detected over the ambient light background by two or more detectors having different sensitivity ranges, or better by a single fast multi-range photodetector giving the possibility to perform time resolved measurements in different optical bands. These known devices can have false-alarm warnings. To avoid the false-alarm warnings it is important to know an appropriate photodetector spectral range and appropriate device speed and spatial resolution. For all these applications, photomultiplier tubes (PMT) are typically used as photodetectors. For instance Hamamatsu PMT UV Tron R2868 is commonly used for flame and fire alarm detection. However, although PMTs have high sensitivity and good timing response, these devices are bulky, expensive, sensitive to magnetic fields, require high operating bias, and have low mechanical and temperature strength.

Another possibility could be the use of two or more discrete solid state detectors having different sensitivity ranges in a single housing. However, this solution does not allow for detection of multiband optical signals with high spatial resolution and, furthermore, metallic or ceramic packages used to house these devices cannot withstand temperatures as high as those achieved in flame monitoring systems. An additional possibility could be the use of different external (and expensive) interferential filters to make a single broadband photodiode sensitive only in selected portions of the electromagnetic spectrum. However, this solution typically implies the use of a broadband photodetector and, what's more, does not allow a fast detection of photons with different wavelengths due to the use of the external filters usually housed in appropriate filter wheels controlled, for instance, by remote.

Moreover the capability of using a single detector as a receiver makes the detection system less expensive and more compact, and, not least, could make it easier for the system vendors to reduce the inventory.

A low operating bias is particularly relevant in low power consumption applications. Electro-tunable multiband photodiodes have known a growing success in last years. The optical absorption of these devices realized by stacking multilayers of different materials with different optical properties and energy gaps (i.e., high cut off wavelength) are modulated by varying the applied reverse bias.

The possibility to modulate the absorption and eventually increase the photodetector sensitivity wavelength range by changing the applied reverse bias has been found to be a powerful tool to reduce the overall number of photodetectors used for the detection of photons in a wide wavelength range.

A multiband spectral infrared photodetector and imager are disclosed by Mitra in US Pat. App. No. 2004/0108461, in which two or more different bands in the infrared wavelength range are detected by a diffractive resonant optical cavity. Furthermore, a device and the relative fabrication method for a two-color infrared detector are disclosed by Park et al. in U.S. Pat. No. 6,049,116, and a multilayer junction photodiode for multiple infrared wavelengths detection is presented by Dutta in US Pat. App. No. 2009/0189207.

On the other hand, Tsang, in US Pat. App. No. 2009/0159785 presents an optical sensing device with multiple photodiode elements and multi-cavity Fabry-Perot ambient light structure in order to detect light signals with different wavelength spectrums.

Korona et al., in the paper "Multiband GaN/AlGaN UV Photodetector, Acta Physica Polonica A, Vol. 110, No 2, pp. 211-217, 2006," present a multiband GaN/AlGaN photodetector structure capable of detecting three UV ranges, tuned by external voltage. The multilayer structures were grown by a Metal Organic Chemical Vapor Deposition (MOCVD) technique, while the device was designed as a Schottky photodiode with a semitransparent continuous gold Schottky contact evaporated on its surface.

However, at the moment these devices experience a poor technological maturity, as is highlighted by their high leakage (dark) current and often by a not optimized control of the optical absorption (i.e., the photoresponse) in different wavelength bands with the bias.

BRIEF SUMMARY

One embodiment is a multiband photodiode capable of detecting light in distinct wavelength bands. By applying a first voltage between an anode and a cathode of the photodiode, the photodiode is sensitive to light in a first wavelength band and insensitive to light in a second wavelength band. By applying a second voltage between the anode and cathode, the photodiode becomes sensitive to light in the second wavelength band.

In one embodiment, the photodiode includes a first layer of semiconductor material, a second layer of semiconductor material positioned on top of the first layer of semiconductor material, and a contact material positioned on the first and second layers of semiconductor material. The photodiode includes a first photodiode junction at an interface between the first layer of semiconductor material and the contact material. The first photodiode junction is positioned below a portion of a first electrode that is opaque to light. The photodiode includes a second photodiode junction at an interface of the second layer of semiconductor material and the contact material. An aperture in the first electrode allows light to pass to respective light receiving areas of the first and second layers of semiconductor material.

In one embodiment, when a first voltage is applied between the first and second electrodes, a depletion area in the second layer of semiconductor material is positioned in the light receiving area of the second layer of semiconductor material, thereby rendering the photodiode sensitive to light in a first wavelength band. The first electrode may be an anode and the second electrode may be a cathode, as discussed in more detail below. When the first voltage is applied between the first electrode and the second electrode, a depletion region in the first layer of semiconductor material does not extend to the light receiving area of the first layer of semiconductor material, thereby rendering the photodiode insensitive to a second wavelength band. When a second voltage is applied between the first and second electrodes, the depletion region in the first layer of semiconductor material extends to the light receiving area of the first layer of semiconductor material, thereby rendering the photodiode sensitive to the second wavelength band. When the first voltage is applied between the first and second electrodes, a depletion region in the second layer of semiconductor material is positioned in the light receiving area of the first layer of semiconductor material, thereby rendering the photodiode sensitive to light in a first wavelength band.

In one embodiment, the contact material is a material that forms a photo diode junction at an interface of the contact material with the second or third layer of semiconductor material. Accordingly, in one embodiment, the contact material is a Schottky contact that forms a Schottky barrier at an interface with the second or third layer of semiconductor material. Alternatively, the contact material can be a semiconductor material of opposite conductivity type (P or N) with the second or third layer. For example, if the second and third layers of semiconductor material are doped with N-type conductivity, then the contact material can be semiconductor material that is doped with P-type conductivity. The contact material can be monocrystalline with the second or third layer of semiconductor material.

BRIEF DESCRIPTION OF THE SEVERAL VIEWS OF THE DRAWINGS

FIGS. 1F-1K are cross sections of the integrated circuit die of FIG. 1A at intermediate stages of processing, according to one embodiment.

DETAILED DESCRIPTION

Figure 1A:
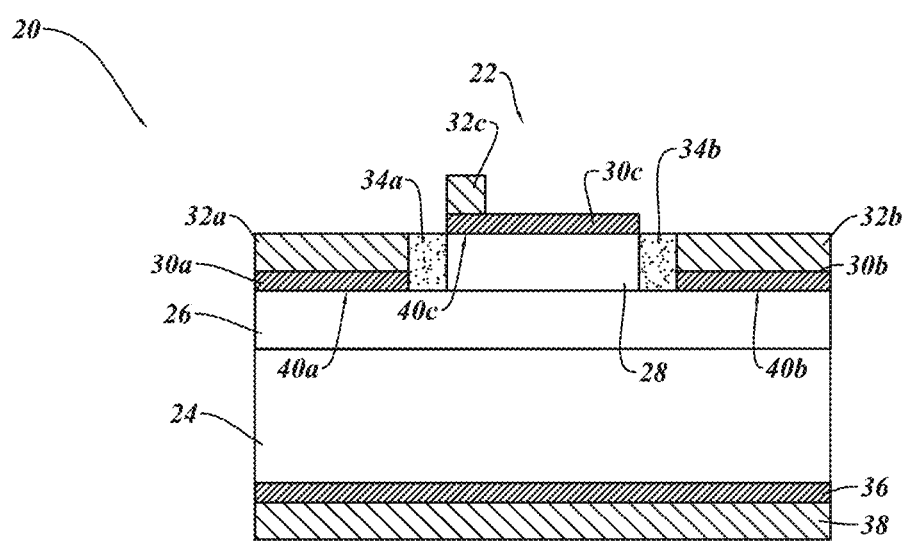
FIG. 1A is cross section of an integrated circuit die including a multiband Schottky photodiode, according to one embodiment.

FIG. 1A is a cross section of an integrated circuit die 20 including a multiband photodiode 22, according to one embodiment. The integrated circuit die 20 includes a first layer of semiconductor material 24, a second layer of semiconductor material 26 positioned on the first layer of semiconductor material 24, and a third layer of semiconductor material 28 positioned on the second layer of semiconductor material 26. The integrated circuit die 20 further includes a first Schottky contact 30a positioned on the second layer of semiconductor material 26, a second Schottky contact 30b positioned on the second layer of semiconductor material 26, and a third Schottky contact 30c positioned on the third layer of semiconductor material 28. A first anode 32a is positioned on the first Schottky contact 30a. A second anode 32b is positioned on the second Schottky contact 30b. A third anode 32c is positioned on the third Schottky contact 30c. Respective dielectric barriers 34a, 34b are positioned between the third layer of semiconductor material 28 and the first and second anodes 32a, 32b. An ohmic contact 36 is positioned below the first layer of semiconductor material 24. A cathode 38 is positioned below the ohmic contact 36. A junction between the second layer of semiconductor material 26 and the first contact 30a is a first Schottky photodiode junction 40a. A junction between the second layer of semiconductor material 26 and the second contact 30b is a second Schottky photodiode junction 40b. A junction between the third contact 30c and the third layer of semiconductor material 28 is a third Schottky photodiode junction 40c.

In one embodiment, the first layer of semiconductor material 24 is monocrystalline 4H—SiC about 300 µm thick. The first layer of semiconductor material 24 is highly doped with N-type dopant atoms at a concentration of about 1e19/cm$^3$. The second layer of semiconductor material 26 is monocrystalline 4H—SiC about 5 µm thick. The second layer of semiconductor material 26 is moderately doped with N-type dopant atoms at a concentration between about 5e15/cm$^3$ and 5e16/cm$^3$. The third layer of semiconductor material 28 is monocrystalline 4H—SiC about 5 µm thick. The third layer of semiconductor material 28 is lightly doped with N-type dopant atoms at a concentration between about 8e13/cm$^3$ and 2e14/cm$^3$. The 4H—SiC material is sensitive in the UV region. Other materials, such as silicon are used in other embodiments to detect other wavelengths, such as infrared. The sensitivity changes based on the selected material.

In one embodiment, the Schottky contacts 30a-30c are formed of a very thin layer of metal selected to form a Schottky barrier with the second layer of semiconductor material 26 and the third layer of semiconductor material 28. In one example, the Schottky contacts 30a-30c are a thin layer of Ni about 10-30 nm thick formed on top of respective portions of the second layer of semiconductor material 26 and the third layer of semiconductor material 28. This nickel layer may also be a nickel silicide layer or other appropriate material. The nickel silicide layer may be formed by a thin nickel layer being deposited, followed by a low temperature rapid thermal annealing process at 700 C, for 20 seconds in a nitrogen environment. In an alternative embodiment, the ohmic contact may be a titanium layer that becomes a titanium silicide after a rapid thermal anneal, such as at 1000 degrees Celsius. The titanium silicide layer would be different from the cathode 38.

In one embodiment, the first, second, and third anodes 32a-32c are formed of a layer of conductive material, such as AlSiCu, about 3 μm thick. The first, second, and third anodes 32a-32c are electrically connected to the respective Schottky contacts 30a-30c on which they are positioned. Though not shown, the first, second, and third anodes 32a-32c re electrically shorted together, thereby forming a single collective anode. Though features 32a-32c may be recited in this description as each being a separate anode, in one embodiment, the anodes 32a-32c are collectively a single anode.

In one embodiment, the dielectric barriers 34a, 34b are SiO₂ about 3-6 μm thick. The dielectric barriers 34a, 34b separate the third layer of semiconductor material 28 from the Schottky contacts 30a, 30b and the anodes 32a, 32b.

In one embodiment, the ohmic contact 36 is a thin layer of conductive material selected to form an ohmic contact with the highly doped first layer of semiconductor material 24. The ohmic contact 36 may be a nickel silicide layer (Ni2Si), which may be formed by sputtering a nickel layer to a thickness of 200 nm, followed by a rapid thermal annealing process (RTA) at 1000 C, 60 seconds in a nitrogen environment.

In one embodiment, the cathode 38 is a highly conductive material, such as a titanium, nickel, gold layer, positioned on the bottom of the ohmic contact 36. The cathode 38 is about 550 nm thick. For example, the titanium layer may be 100 nm thick, the nickel layer may be 400 nm thick, and the gold layer may be 50 nm thick. Though the cathode 38 and the ohmic contact 36 are referred to separately, the ohmic contact and the cathode 38 can be considered collectively to be a cathode in ohmic contact with the first layer of semiconductor material 24.

The junctions 40a-40c are Schottky barriers that have a rectifying function, i.e., current only flows in one direction across the junction. Thus, the junctions 40a-40c act as individual diodes that allow current to flow in one direction but not the other.

Under forward bias conditions, i.e., when the anodes 32a-32c have a higher voltage than the cathode 38, a continuous current flows across the junctions 40a-40c from the Schottky contacts 30a-30c to the second and third semiconductor layers 26, 28, and on to the cathode 38. In other words, under forward bias conditions, current flows from the anodes 32a-32c to the cathode 38.

Under reverse bias conditions, i.e., the anodes 32a-32c have a lower voltage than the cathode 38, the junctions 40a-40c act as photodiode junctions. Under reverse bias conditions, a depleted region forms in the second and third layers of semiconductor material 26, 28 near the junctions 40a-40c. The depleted region is characterized by a lack of free charges. Previously free electrons have combined with holes, leaving a region depleted of free charges. An electric field is present in the depleted region. The direction of the electric field is such that any free electrons are driven away from the junction toward the cathode 38. Photo-generated holes can contribute to the measured signal. They are swept away towards the anode (top contact) while the electrons are moved towards the cathode (bottom contact). The Schottky diode is normally a unipolar device in normal operation conditions. However, during photo-generation holes can give a contribution to the photocurrent.

An electron hole pair can be generated if an electron in the valence band absorbs a photon in the depleted region. In particular, if a photon having an energy greater than or equal to the bandgap between the valence band and the conduction band of the second or third layer of semiconductor material 26, 28 is absorbed by an electron in the second or third layer of semiconductor material 26, 28, then the electron gains enough energy to transition from the valence band to the conduction band. This generates a free electron and a hole. Because the electron is now in the conduction band, the electric field in the depletion region drives the electron to the cathode 38. As more electrons absorb light and transition to the conduction band, a current is generated in the photodiode 22. The current is proportional to the intensity of light having a particular energy incident on the photodiode 22.

The energy E of a photon is given by the following equation:

$$E = h*f,$$

where f is the frequency of the light and h is Planck's constant. The frequency f of light is related to the wavelength λ of light by the following equation:

$$f = c/\lambda,$$

where c is the speed of light. Thus, the wavelength λ of the photon is related to the energy E of the photon by the following equation:

$$\lambda = h*c/E.$$

The bandgap is a property particular to a given semiconductor material. The bandgap is the energy difference between the valence band, in which an electron is not free to move through a crystal lattice, and the conduction band, in which the electron is free to move throughout the crystal lattice. If an electron in the valence band, i.e., an electron currently paired with a hole, absorbs a photon having an energy equal to or slightly greater than the bandgap of the semiconductor material, then the electron transitions across the bandgap from the valence band to the conduction band. Thus, photons in a particular range of wavelengths can cause electrons to transfer from the valence band to the conduction band, thereby generating current in the photodiode 22.

Figure 1B:
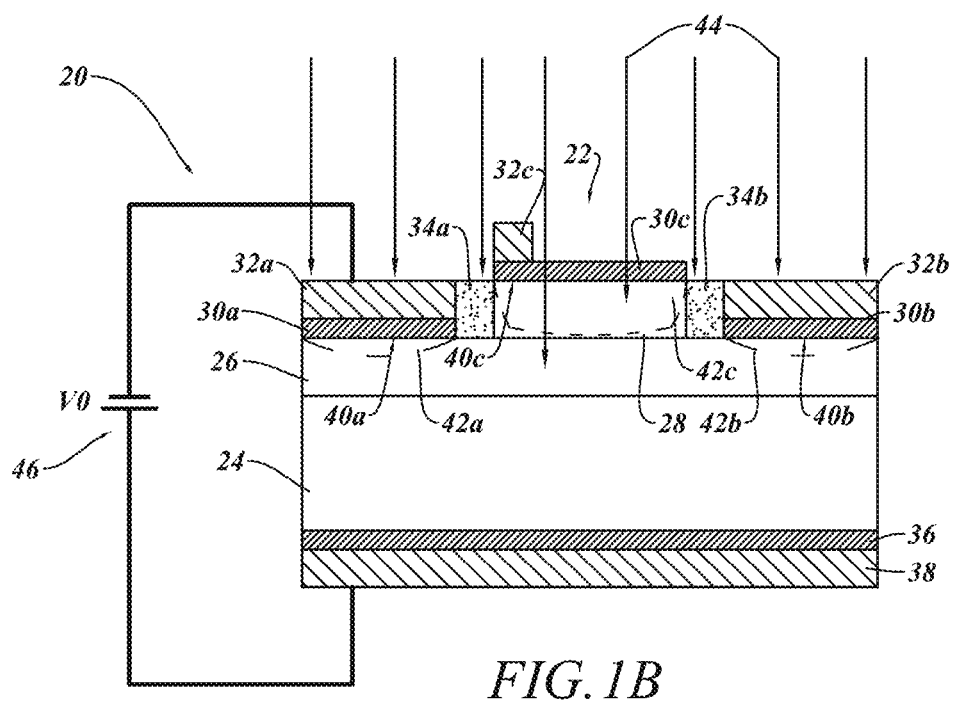
FIG. 1B is a cross section of the integrated circuit die of FIG. 1A when a first voltage is applied to electrodes of the multiband Schottky photodiode, according to one embodiment.

FIG. 1B is a cross section of the integrated circuit die 20 of FIG. 1A with a first voltage V0 applied between the anodes 32a-32c and the cathode 38 by a power supply 46. In one example, the first voltage V0 is 0 V. Alternatively, the first voltage V0 can be a small reverse bias voltage less than 2 V in absolute magnitude, but greater than 0 V in absolute magnitude. Under reverse bias conditions, the anodes 32a-32c have a lower voltage than the cathode 38.

Dashed lines indicate depletion regions 42a-42c in the second and third layers of semiconductor material 26, 28, i.e., regions where there are no free holes or electrons. The depletion region 42a corresponds to the depletion region in the second layer of semiconductor material 26 adjacent to the junction 40a with the Schottky contact 30a. The depletion region 42b corresponds to the depletion region in the second layer of semiconductor material 26 adjacent to the junction 40b with the Schottky contact 30b. The depletion region 42c corresponds to the depletion region in the third layer of semiconductor material 28 adjacent to the Schottky contact 30c.

The sizes of the depletion regions 42a-42c depend on the magnitude of the voltage V0 and the concentration of dopant atoms in the second and third layers of semiconductor material 26, 28. The higher the concentration of dopant atoms in a layer of semiconductor material, the smaller the depletion region will be at low-voltage. Because there is a much higher concentration of dopant atoms in the second layer of semiconductor material 26 ($\sim$1e16/cm$^3$) than in the third layer of semiconductor material 28 ($\sim$1e14/cm$^3$), the depletion regions 42a, 42b are much smaller than the depletion region 42c in the third layer of semiconductor material 28 at V0=0 V.

Light (photons) 44, shown as straight arrows in FIG. 1B, is incident on the photodiode 22. The relatively thick conductive material of the anodes 32a-32c is opaque to the light 44. Thus, the light 44 does not pass to those regions of the second and third layers of semiconductor material 26, 28 that are directly below the anodes 32a-32c. However, the thin Schottky contact 30c is partially transparent to light, thereby allowing the light 44 to pass through the Schottky contact 30c to the second and third layers of semiconductor material 26, 28 directly below the portion of the Schottky contact 30c that is not covered by the anode 32c. Thus, the gap between the anodes 32a, 32b is an aperture through which the light 44 can pass, except through the anode 32c. Those areas of the second and third layers of semiconductor material 26, 28 directly below the aperture in the anodes 32a-32c are light receiving areas of the second and third layers of semiconductor material 26, 28.

Some of the light 44 passing through the Schottky contact 30c will be absorbed by the third layer of semiconductor material 28. Additionally, some of the light 44 will pass through the third layer of semiconductor material 28 into the second layer of semiconductor material 26 and will be absorbed by the second layer of semiconductor material 26. When the light 44 is absorbed by an electron in the depletion region 42c of the third layer of semiconductor material 28, the electron enters the conduction band and is driven to the cathode 38, thereby generating current. However, because the depletion regions 42a, 42b do not extend directly below the Schottky contact 30c, the photodiode 22 is not sensitive to longer wavelengths of light when the voltage V0 is applied between the anodes 32a-32c and the cathode 38.

Figure 1C:
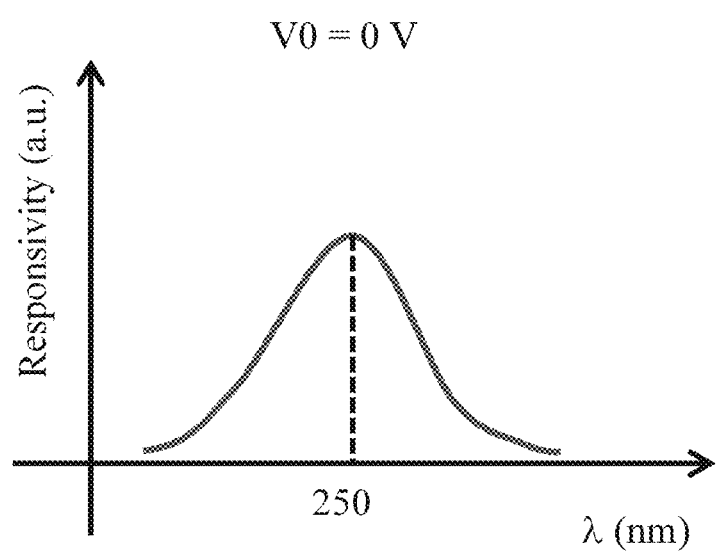
FIG. 1C is a graph illustrating responsivity of the photodiode of FIG. 1A when the first voltage is applied, according to one embodiment.

FIG. 1C is a graph of the responsivity of the photodiode 22 versus wavelength of light $\lambda$ when the voltage V0 is applied between the anodes 32a-32c and the cathode 38. There is a peak responsivity at a wavelength of $\lambda$=250 nm. In other words, the photodiode 22 generates a photo current that is proportional to the intensity of light incident on the photodiode 22 with a wavelength $\lambda$ of 250 nm.

Figure 1D:
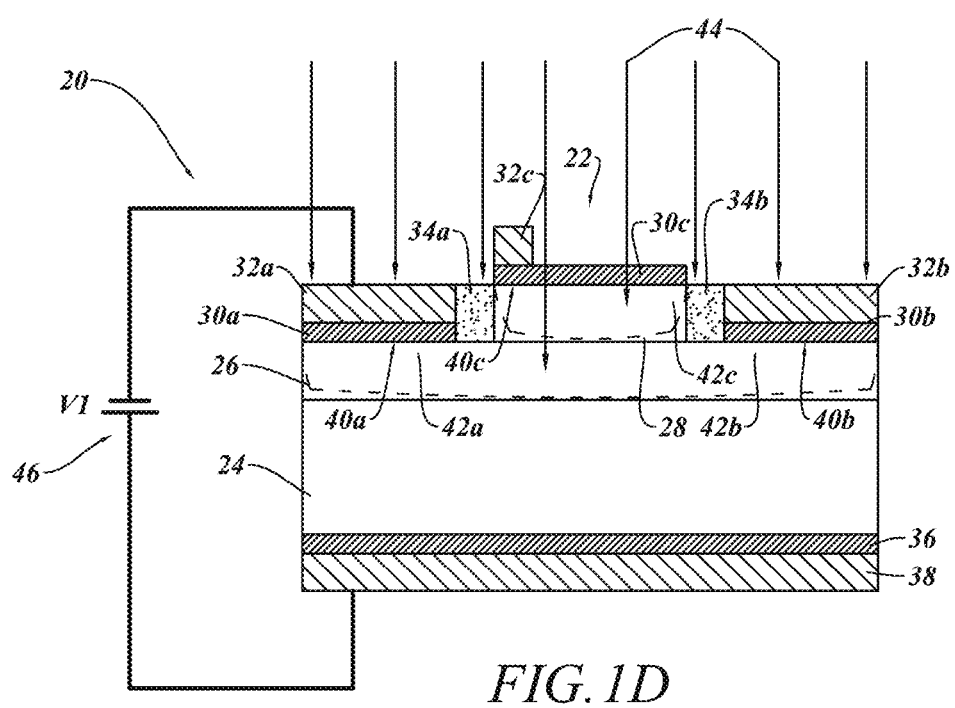
FIG. 1D is a cross section of the integrated circuit die of FIG. 1A when a second voltage is applied to electrodes of the multiband Schottky photodiode, according to one embodiment.

FIG. 1D is a cross section of the integrated circuit die 20 of FIG. 1A under conditions in which a higher reverse bias voltage V1 is applied between the anodes 32a-32c and the cathode 38. The photodiode 22 in FIG. 1D is substantially similar to the photodiode 22 of FIG. 1B except that the voltage V1 is applied between the anodes 32a-32c and the cathode 38. The application of the higher reverse bias voltage V1 has caused the depletion regions 42a, 42b in the second layer of semiconductor material 26 to expand and merge together. Most notably, the depletion regions 42a, 42b now extend to the light receiving area below the Schottky contact 30c.

Because the depletion regions 42a, 42b in the second layer of semiconductor material 26 now extend to the light receiving areas below the Schottky contact 30c, the effective depth of the depletion region 42c has increased to include the depth of the second layer of semiconductor material 26, thereby rendering the photodiode 22 responsive to light with a longer wavelength $\lambda$. In particular, the photodiode 22 now has two peak sensitivity wavelengths $\lambda$: 250 nm and 330 nm. This is most clearly illustrated by the graph of FIG. 1E.

Figure 1E:
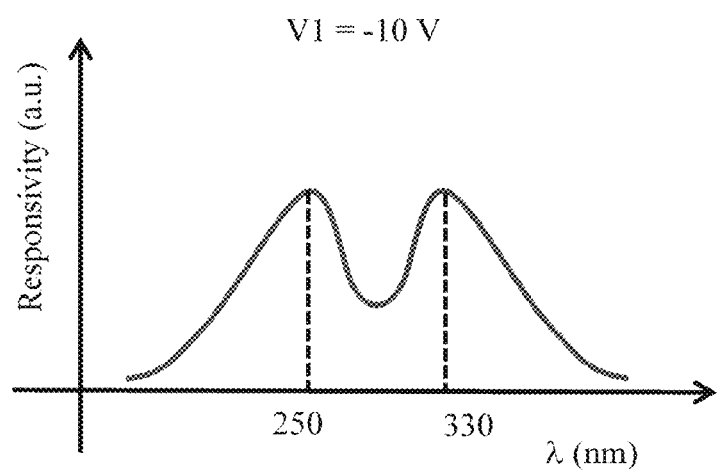
FIG. 1E is a graph illustrating responsivity of the photodiode of FIG. 1A when the second voltage is applied, according to one embodiment.

FIG. 1E is a graph of the responsivity of the photodiode 22 versus wavelength of light $\lambda$ when the voltage V1 is applied between the anodes 32a-32c in the cathode 38. There are now two peaks in the responsivity: one at $\lambda$=250 nm and one and $\lambda$=330 nm. Wavelengths between the two peaks are only weakly absorbed. The sensitivity of the photodiode 22 does not change for $\lambda$=250 nm when the voltage applied between the anodes 32a-32c in the cathode 38 increases from V0 to V1. Thus, the current in the photodiode 22 at V0 gives an indication of the intensity of light having a wavelength of $\lambda$=250 nm with little or no contribution from light having a wavelength of $\lambda$=330 nm. The current in the photodiode 22 at V1 includes a contribution from light at both $\lambda$=250 nm and $\lambda$=330 nm. The difference in the currents in the photodiode at V1 and V0 gives an indication of the intensity of light having a wavelength of 330 nm. Thus, a single photodiode 22 can effectively measure two distinct bands of wavelengths by merely switching between a first voltage V0 and a second voltage V1 applied between the anodes 32a-32c in the cathode 38 and measuring the current when V0 is applied as well as the difference between the currents when V0 and V1 are applied.

The particular values of the wavelength bands can be chosen by carefully selecting the thicknesses and doping profiles of the second and third layers of semiconductor material 26, 28. The thickness of the third epitaxial layer can be suitably chosen in order to select a cut-off high wavelength for the lower range wavelengths. Likewise, the thickness of the second epitaxial layer 26 can be chosen to select a higher cut off wavelength for the higher range wavelengths. The doping and thickness of the second layer of semiconductor material are chosen suitably high in order to avoid depletion at low reverse bias.

Moreover the thick metal anodes 32a, 32b layer above the lateral junctions 40a, 40b, acts as a blinding layer and thus does not allow the absorption of low wavelength photons at these junctions. The application of a higher reverse bias (typically anode contact set at ground, cathode set at a positive bias) depletes the second layer of semiconductor material 26 below the central Schottky contact 30c. The application of this higher reverse bias is not able to modify the thickness of the depletion region 42c in the third layer of semiconductor material 28 because it is fully depleted already at very low reverse bias. However application of the higher reverse bias voltage V1 expands the depletion regions 42a, 42b of the second layer of semiconductor material 26 to the light receiving areas underlying the fully depleted third layer of semiconductor material 28. This increases the thickness of the active area of the photodiode, thereby making it sensitive to longer wavelengths (i.e. the range of sensitivity of the first junction is enlarged towards higher wavelength values due to the increase of the thickness of the active layer). In this way the photodiode 22 can be sensitive in different wavelength ranges simply by switching the reverse bias from a low value V0 to a high value V1 and can again become sensitive to only the first limited range of wavelengths by switching the bias from the high voltage V1 to the low voltage V0 chosen for the operation of the photodiode 22.

The photodiode structure of FIG. 1A is extremely useful in all the applications where two or more wavelength photon fluxes in different wavelength ranges have to be detected.

Though particular layer thicknesses, layer arrangements, doping schemes, and materials have been described in relation to FIGS. 1A-1E, those of skill in the art will recognize that many alternate arrangements are possible. For example, the layers of semiconductor material can be doped P-type and the material for the Schottky contacts 30a-30c can be selected to form a Schottky barrier with the P-type semiconductor materials.

While FIGS. 1A, 1B, 1D have shown the Schottky contacts 30a, 30b as being distinct, in practice the Schottky contacts 30a, 30b can be a single lateral Schottky contact surrounding the center Schottky contact 30c. The single lateral Schottky contact can be annular in shape, rectangular in shape, or any other suitable shape. Likewise, the anodes 32a, 32b can be a single integral anode having an annular or rectangular aperture therein in which the central Schottky contact 30c can be positioned.

Figure 1F:
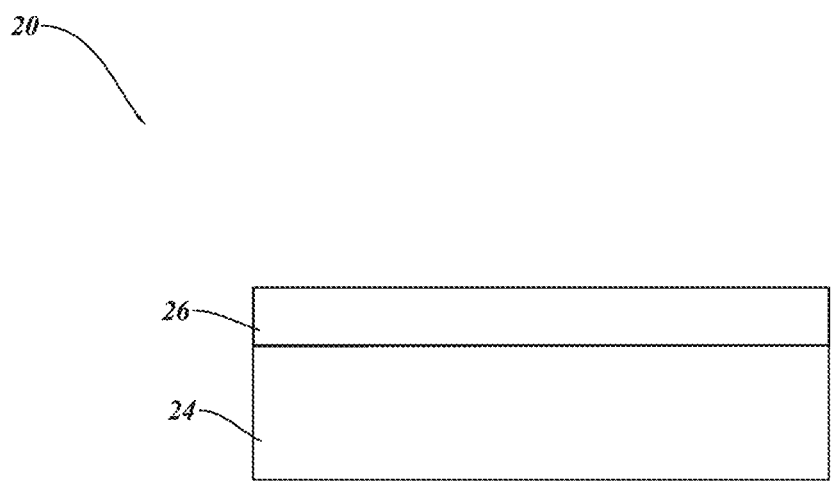

FIGS. 1F-1K illustrate sequential process steps for manufacturing the photodiode 22 of FIG. 1A. In FIG. 1F, the first layer of semiconductor material 24, which could be monocrystalline 4H—SiC about 300 nm thick, is doped with N-type donor atoms with a concentration of about $1e19/cm^3$. The second layer of semiconductor material 26 is epitaxially grown from the first layer of semiconductor material 24. The second layer of semiconductor material 26 may be doped with N-type donor atoms with a concentration between about $5e15/cm^3$ and $5e16/cm^3$. The second layer of semiconductor material 26 can be doped in situ during the epitaxial growth. The second layer of semiconductor material 26 may be about 5 µm thick.

Figure 1G:
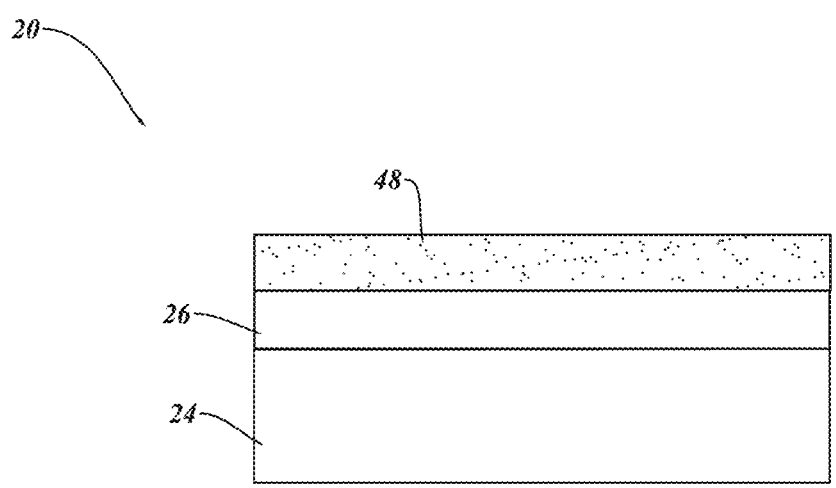

In FIG. 1G the top surface of the integrated circuit die 20 is cleaned to remove any impurities or any dielectric growth on the surface of the second layer of semiconductor material 26. A sacrificial layer, such as tantalum carbide 48 is formed on the second layer of semiconductor material 26. The layer of tantalum carbide 48 is about 5 µm thick. The layer of tantalum carbide 48 can be formed by chemical vapor deposition (CVD) or by any other suitable method.

Figure 1H:
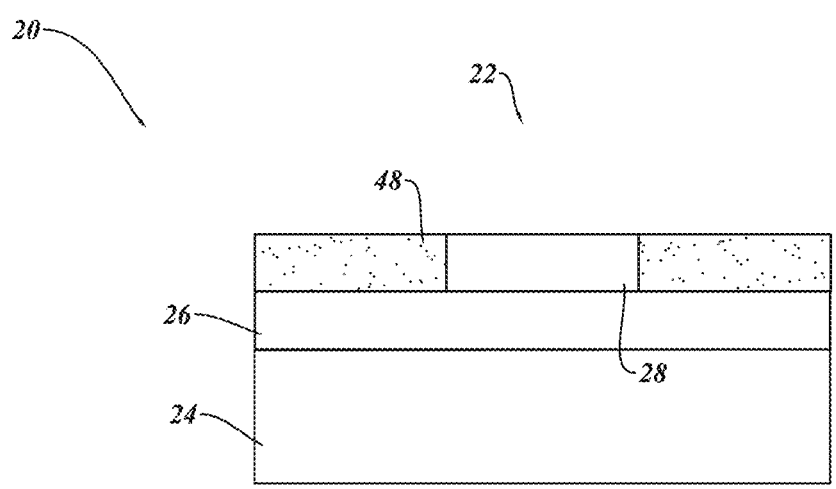
Figure 11:
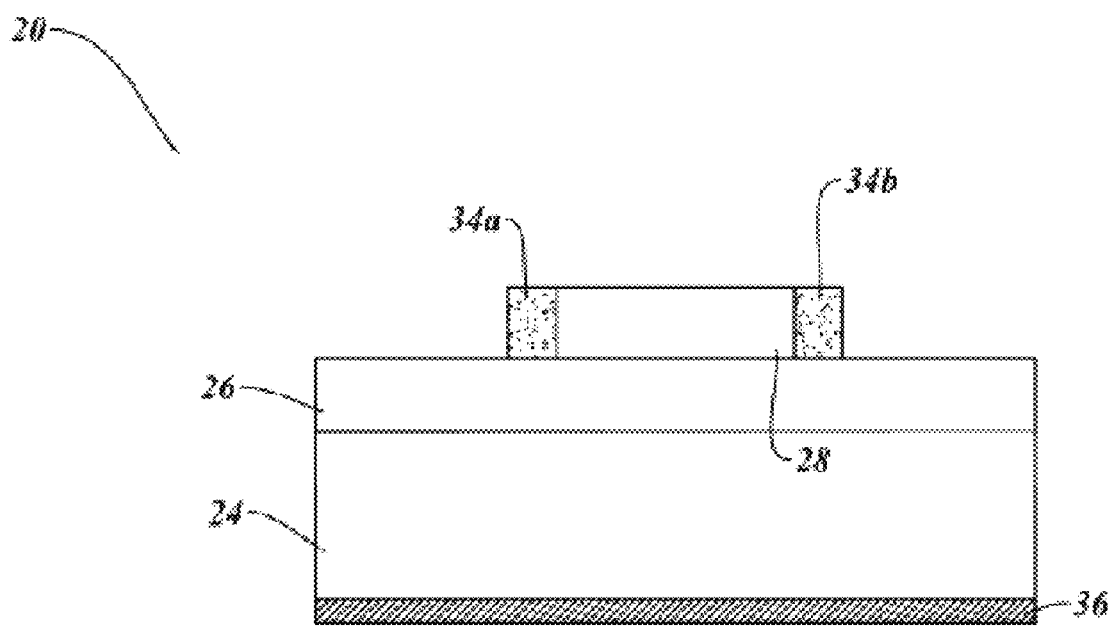

In FIG. 1H the layer of tantalum carbide 48 is patterned and etched via common photolithography techniques to remove a central portion of the layer of tantalum carbide 48. A selective epitaxial growth is then performed whereby the third layer of semiconductor material 28 is grown from the second layer of semiconductor material 26 in a gap opened in the layer of tantalum carbide 48. The third layer of semiconductor material 28 may be about 5 µm thick. The third layer of semiconductor material 28 may be doped with N-type donor atoms with a concentration of about $1e14/cm^3$. The third layer of semiconductor material 28 can be doped in situ during the epitaxial growth or by other implantation techniques.

The ohmic contact 36 is formed on the backside of the first layer of semiconductor material 24 after the tantalum carbide layer is etched and after the third layer of semiconductor material is formed. A protective silicon nitride layer may be formed over the tantalum carbide layer and the third layer of semiconductor material to protect these layers as the ohmic contact is formed. As noted above, the ohmic contact may be a nickel silicide or other appropriate material.

In FIG. 1I, dielectric barriers 34a, 34b are formed adjacent to the sides of the third layer of semiconductor material 28. The dielectric barriers 34a, 34b are for example silicon dioxide or TEOS. The silicon dioxide can be formed by CVD. The dielectric barriers 34a, 34b are patterned to exposed portions of the second layer of semiconductor material 26. While the dielectric barriers 34a, 34b are shown as distinct dielectric barriers, in practice the dielectric barriers 34a, 34b can be a single continuous annular or rectangular dielectric barrier surrounding the third layer of semiconductor material 28.

Figure 1J:
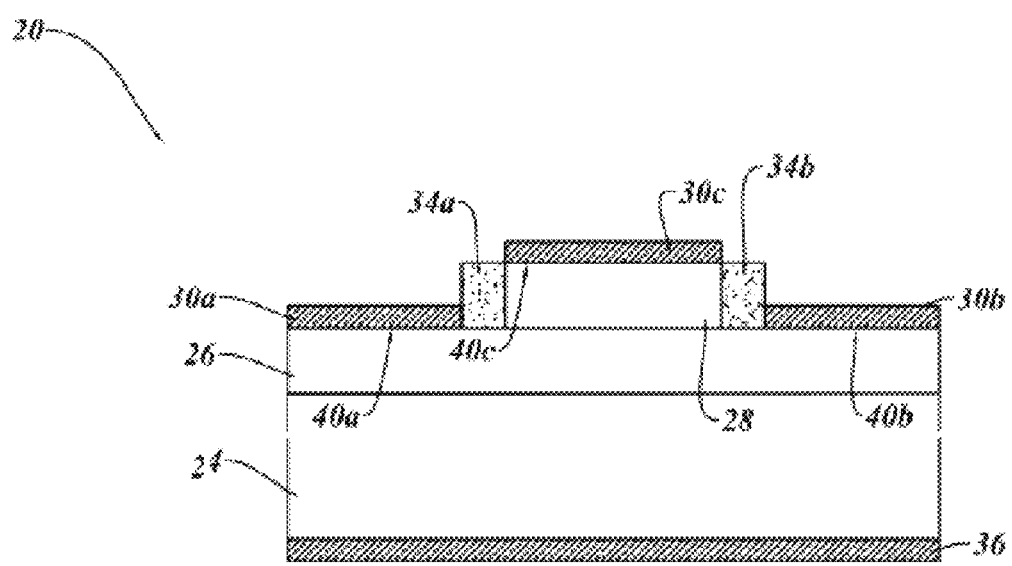

In FIG. 1J, Schottky contacts 30a, 30b, 30c are formed by depositing a thin layer of conductive material, such as nickel by physical vapor deposition on the exposed surfaces of the second layer of semiconductor material 26, the dielectric barriers 34a, 34b, and the third layer of semiconductor material 28. The thin layer of conductive material can be annealed to form a silicide and can be patterned and etched using common photolithography techniques to leave the Schottky contacts 30a-30c. Alternatively, depending on the materials used, portions of the conductive material that have not reacted with the underling layer of semiconductor material can be removed with a wet etch. The Schottky contacts 30a, 30b, 30c are formed from semitransparent material, which nickel silicide can be. The nickel may be sputtered to be 10 nm thick and then be subjected to a rapid thermal anneal at 700 degrees Celsius for 20 seconds in an N2 environment. The non-annealed nickel layer can be removed by a wet etch.

Figure 1K:
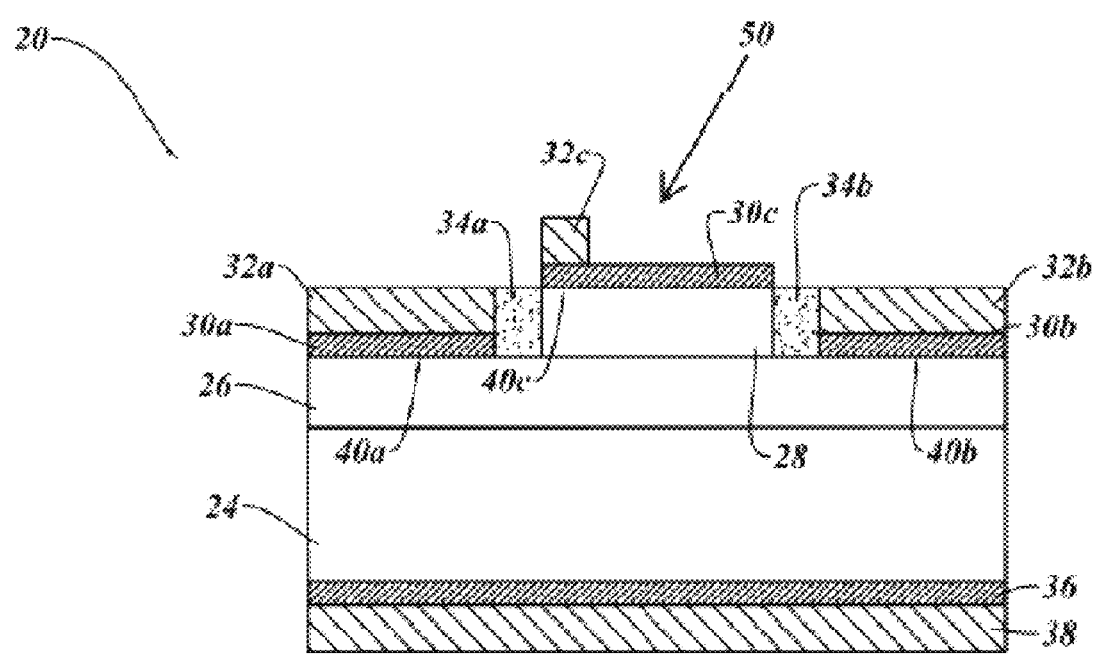

In FIG. 1K, anodes 32a-32c are formed by depositing another layer of conductive material, such as AlSiCu or a Ti/AlSiCu on the exposed surfaces of the Schottky contacts 30a-30c and on the dielectric barriers 34a, 34b. The layer of conductive material is then patterned and etched using common photolithography techniques to leave anodes 32a-32c. Patterning of the anodes 32a-32c leaves an aperture 50 in the anode through which light can pass to light receiving areas of the second and third layers of semiconductor material 26, 28. The anodes 32a-32c are optically blinding such that they prevent photons from entering the semiconductor layer below the anode. The anode is thick to ensure the anode is "photon blind," the junction below the anode is not optically active.

At this point, the cathode 38 is formed on the ohmic contact on the backside of the first layer of semiconductor material 24 in order to obtain the structure shown in FIG. 1A. The cathode 38 is a conductive layer, which may include titanium, nickel, and gold, or other suitable materials. The cathode can be formed by depositing, via physical vapor deposition, a thin layer of titanium followed by a thin layer of nickel and another thin layer of gold. The titanium is for example 100 nm thick. The nickel is for example 400 nm thick. The gold is, for example, 50 nm thick.

While particular materials, layers, configurations, processes, and dimensions have been described in relation to forming the photodiode 22 of FIG. 1A, those of skill in the art will recognize, in light of the present disclosure, that many other materials, arrangements, processes, and dimensions can be used to obtain the photodiode 22 in accordance with principles of the present disclosure.

Figure 2A:
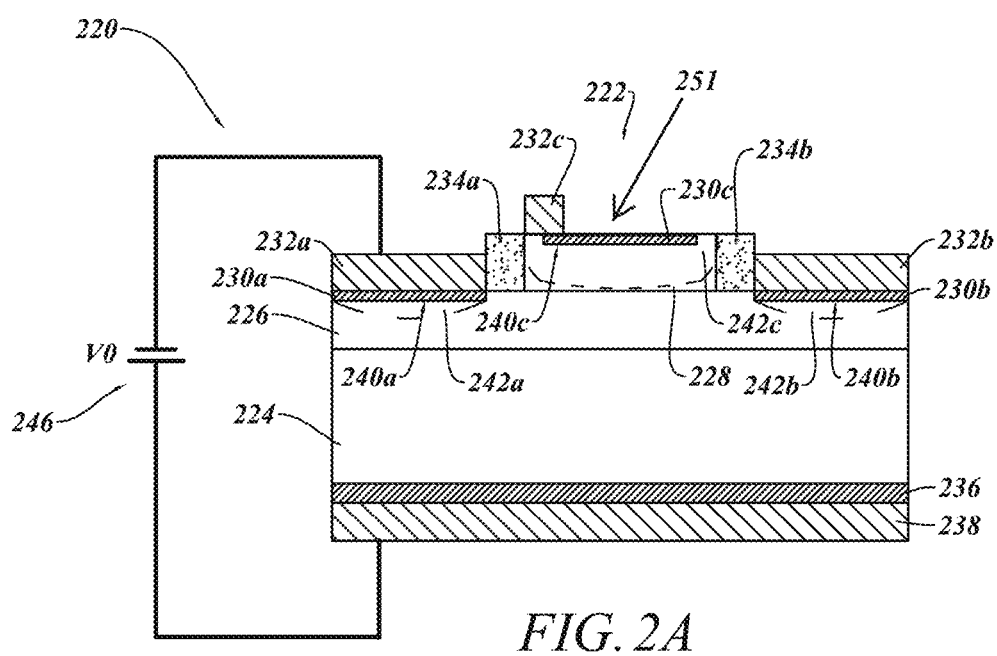
FIG. 2A is a cross section of an integrated circuit die including a multiband P-N photodiode when a first voltage is applied to electrodes of the multiband P-N photodiode, according to one embodiment.

FIG. 2A is a cross section of an integrated circuit die 220 including a multiband photodiode 222, according to one embodiment. The integrated circuit die 220 includes a first layer of semiconductor material 224, a second layer of semiconductor material 226 positioned on the first layer of semiconductor material 224, and a third layer of semiconductor material 228 positioned on the second layer of semiconductor material 226. The first, second, and third layers of semiconductor material 224, 226, 228 are doped, for example, N. The integrated circuit die 220 further includes a first P-type contact 230a positioned on the second layer of semiconductor material 226, a second P-type contact 230b positioned in the second layer of semiconductor material 226, and a third p-type contact 230c positioned in the third layer of semiconductor material 228. A first anode 232a is positioned on the first P-type contact 230a. A second anode 232b is positioned on the second P-type contact 230b. A third anode 232c is positioned on the third P-type contact 230c. Respective dielectric barriers 234a, 234b are positioned between the third layer of semiconductor material 228 and the first and second anodes 232a, 232b. An ohmic contact 236 is positioned below the first layer of semiconductor material 224. A cathode 238 is positioned below the ohmic contact 236. A junction between the N-type portion of the second layer of semiconductor material 226 and the first P-type contact 230a is a first P-N photodiode junction 240a. A junction between the N-type portion of the second layer of semiconductor material 226 and the second P-type contact 230b is a second P-N photodiode junction 240b. A junction between the third P-type contact 230c and the N-type third layer of semiconductor material 228 is a third P-N photodiode junction 240c.

In one embodiment, the first layer of semiconductor material 224 is monocrystalline Si about 500 µm thick. The first layer of semiconductor material 224 is highly doped with N-type dopant atoms with a concentration of about $1e19/cm^3$. The second layer of semiconductor material 226 is monocrystalline Si about 5 µm thick. The second layer of semiconductor material 226 is moderately doped with N-type dopant atoms at a concentration of about $1e16/cm^3$. The third layer of semiconductor material 228 is monocrystalline Si about 5 µm thick. The third layer of semiconductor material 228 is lightly doped with N-type dopant atoms at a concentration of about $1e14/cm^3$.

In one embodiment, the P-type contacts 230a-230c are doped with P-type acceptor atoms with a concentration between about $1e18/cm^3$ and $1e19/cm^3$.

In one embodiment, the first, second, and third anodes 232a-232c are formed of a layer of conductive material, such as AlSiCu, about 3 µm thick. The first, second, and third anodes 232a-232c are electrically connected to the respective P-type contacts 230a-230c on which they are positioned. The first, second, and third anodes 232a-232c are electrically shorted together, thereby forming a single collective anode.

In one embodiment, the dielectric barriers 234a, 234b are $SiO_2$ about 3-6 µm thick. The dielectric barriers 234a, 234b separate the third layer of semiconductor material 228 from the P-type regions 230a, 230b and the anodes 232a, 232b.

In one embodiment, the ohmic contact 236 is a thin layer of conductive material selected to form an ohmic contact with the highly doped first layer of semiconductor material 224. The ohmic contact 236 can include a metal, such nickel silicide in direct contact with the bottom side of the first layer of semiconductor material 224.

In one embodiment, the cathode 238 is a highly conductive material, such as a combination layer of titanium, nickel, and gold, positioned on the bottom of the ohmic contact 236. The cathode 238 is about 550 nm thick.

The photodiode 222 of FIG. 2A operates according to substantially similar principles of the photodiode 22 of FIG. 1B. In particular, when a low-voltage V0 (for example 0 V) is applied between the anodes 232a-232c and the cathode 238 by the power supply 246, the lightly doped third layer of semiconductor material is nearly entirely depleted. In other words, the depletion region 242c of the third layer of semiconductor material 228 takes up nearly the entire third layer of semiconductor material 228. Thus light passes through the top surface of the P-type region 230c or through the top of the third layer of semiconductor material 228 and can be absorbed in the third layer of semiconductor material 228 or in the second layer of semiconductor material 226. If light is absorbed in the depletion region 242c of the third layer of semiconductor material 228, then current passes between the anode 232c and the cathode 238. Because the depletion regions 242a, 242b do not extend directly below an aperture 251 in the anodes 232a-232c when the low-voltage V0 is applied between the anodes 232a-232c and the cathode 238, light that passes to the second layer of semiconductor material 226 will not generate current in the photodiode 222. The photodiode 222 absorbs light with a wavelength of about 300 nm when the voltage at V0 is applied between the anodes 232a-232c and the cathode 238.

Figure 2B:
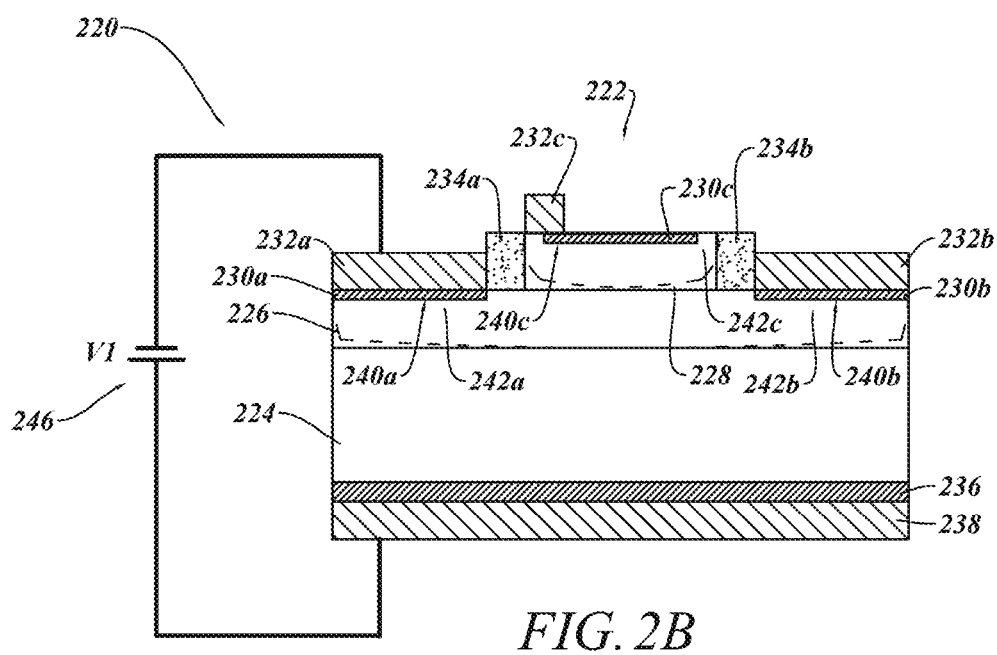
FIG. 2B is a cross section of the integrated circuit die of FIG. 2A when a second voltage is applied to electrodes of the multiband P-N photodiode, according to one embodiment.

In FIG. 2B, a high reverse bias voltage V1 (for example, −10 V) is applied between the anodes 232a-232c and the cathode 238. As a result, the depletion regions 242a, 242b in the second layer of semiconductor material 226 expand until they join and take up nearly the entirety of the second layer of semiconductor material 226. Thus, the depletion regions 242a, 242b extend directly below the third P-type contact 230c through which light can pass to the third layer of semiconductor material 228 and the second layer of semiconductor material 226. Because depletion regions 242a, 242b have increased the effective depth of the depletion region 242c, the photodetector 222 is able to detect light at two different peaks in two different wavelength bands. In particular, the photodiode 222 is sensitive to light at 300 nm and 800 nm in wavelength in a similar fashion as described previously with respect to FIG. 1D.

The photodiode 222 of FIGS. 2A, 2B can be manufactured by growing the second and third layers of semiconductor material 226, 228 epitaxially. The second and third layers of semiconductor material 226, 228 can be doped in situ during the epitaxial growth.

After the epitaxial growth of the two epitaxial layers, a sacrificial layer can be deposited, such as a TEOs layer that is 8 um thick. The sacrificial layer can be patterned to form a mask to define a shape of the third layer of semiconductor material. A photoresist layer may be used as the mask. The third layer of semiconductor material can be etched, such as a trench etch around the central junction to form the remaining third layer of semiconductor material 228. The trench depth is at least higher than a thickness of the third semiconductor 228 and lower than a sum of the thicknesses of the second and third semiconductor layers 226 and 228. Once the shape of the third layer of semiconductor is formed, the sacrificial layer is removed.

A layer of dielectric material, such as silicon dioxide about 1 µm thick, is then deposited by chemical vapor deposition on the second and third layers of semiconductor material 226, 228. The layer of the dielectric material is patterned and etched to expose the portions of the second and third layers of semiconductor material 226, 228 that will become the P-type contacts 230a-230c. A very thin oxide layer is then grown on the exposed portions of the second and third layers of semiconductor material 226, 228. Acceptor atoms are then implanted through the thin oxide layer into the second and third layers of semiconductor material 226, 228, thereby leaving P-type contacts 230a-230c on the second and third layers of semiconductor material 226, 228. The thin layer of dielectric material is then removed and anodes 232a-232c are formed on the P-type contacts 230a-230c in substantially the same manner as the anodes 30a-30c described with respect to FIG. 1A. The ohmic contact 236 and the cathode 238 are likewise formed in substantially the same manner as the ohmic contact 36 and the cathode 38 of FIG. 1A.

Figure 2C:
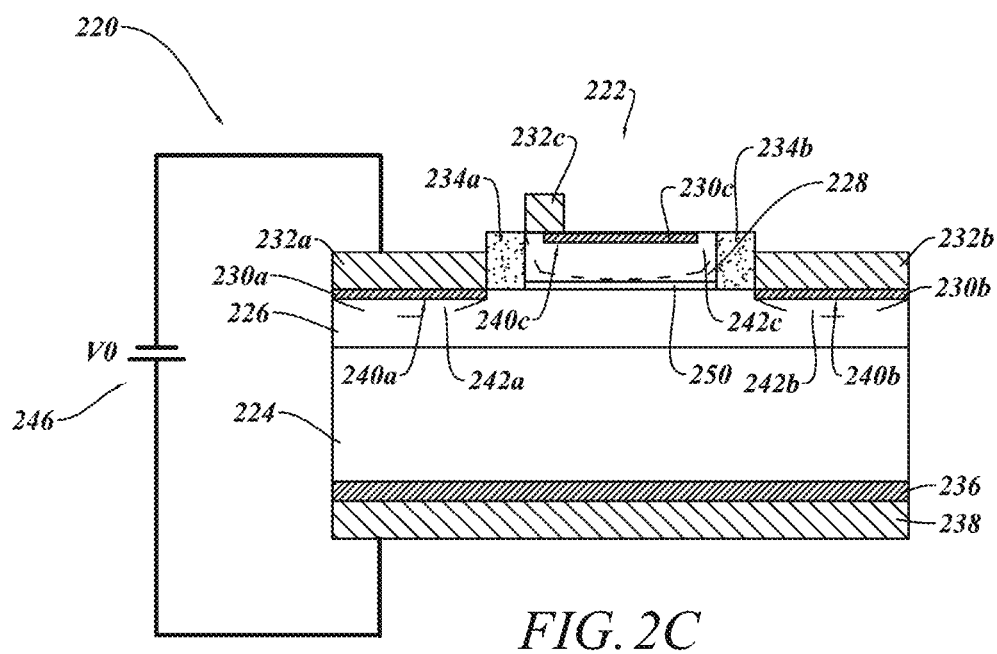
FIG. 2C is a cross section of an integrated circuit die including a multiband P-N photodiode with a buffer layer positioned between a first and a second layer of semiconductor material, according to one embodiment.

FIG. 2C includes a photodiode 222 according to an alternate embodiment. The photodiode 222 of FIG. 2C is substantially similar to the photodiode 222 of FIGS. 2A, 2B. However, the photodiode 222 of FIG. 2C includes a fourth layer of semiconductor material 250 positioned between the second layer of semiconductor material 226 and the third layer of semiconductor material 228. The fourth layer of semiconductor material 250 is a highly doped buffer layer between about 100 nm and 1 μm in thickness. The buffer layer 250 is moderately doped with N-type donor atoms at a concentration between about $5e15/cm^3$ and $6e15/cm^3$. When the high reverse bias voltage V1 (e.g. =10 V is applied between the anodes 232a-232c and the cathode 238, the buffer layer 250 is not depleted and is therefore not optically active. This results in a further decrease in sensitivity to light in the range between the first and second peaks of 300 nm and 800 nm in wavelength, if made with silicon. This equates to an increase in the sensitivity of the photodiode 222. To have the wavelengths of 250 nm and 330 nm for peaks, the devices described in FIGS. 2A, 2B, and 2C are formed using 4H—SiC.

The buffer layer 250 can also be implemented in the photodiode 222 of FIG. 1A with a similar result as that described above with respect to FIG. 2C.

In an alternative embodiment, the dielectric barriers 234a, 234b may have extensions such that a portion of the dielectric barrier extends over a top surface of the third layer of semiconductor material 228 from both the left and the right side. This may make the region exposed for the contact 230c smaller. In addition, along a bottom surface of the dielectric barriers 234a, 234b, a small extension, thinner than the dielectric barriers can extend to the left and right away from the a third layer of semiconductor material 228 to cover a larger portion of the top surface of the second layer of semiconductor material 226. This would make a larger space between the contacts 230a, 230b, and the region directly below the third layer of semiconductor material 228.

Figure 3:
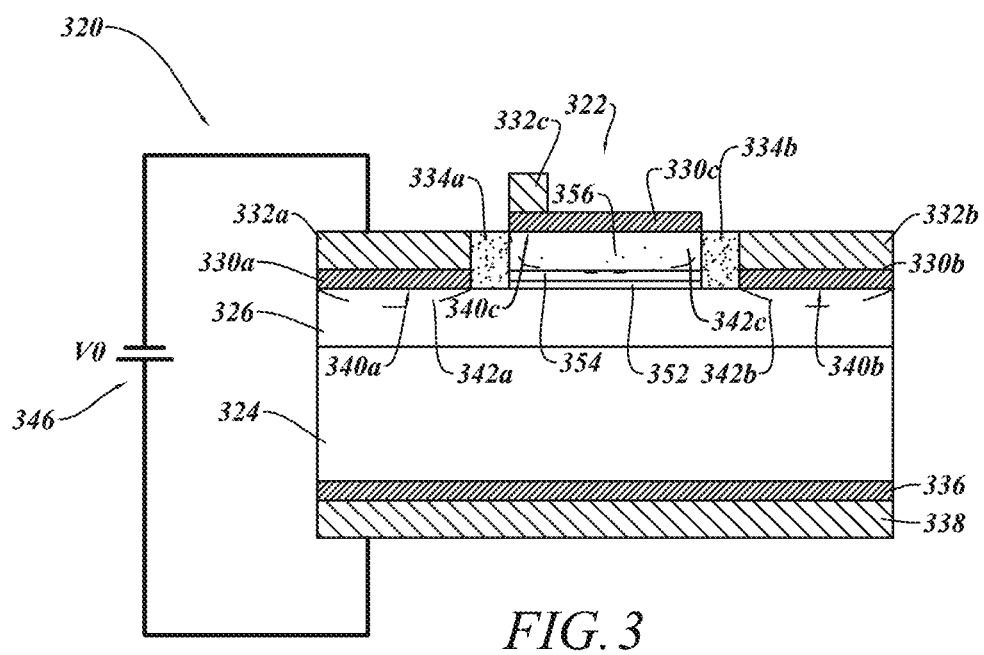
FIG. 3 is a cross section of an integrated circuit die including a multiband Schottky photodiode having a layer of dielectric material positioned between a first layer of semiconductor material and a second layer of semiconductor material, according to one embodiment.

FIG. 3 is a cross section of an integrated circuit die 320 including a photodiode 322 according to one embodiment. The integrated circuit die 320 includes a first layer of semiconductor material 324, a second layer of semiconductor material 326 positioned on the first layer of semiconductor material 324, a dielectric layer 352, and a transparent conductive oxide 354 positioned on the dielectric layer 352. A layer of polysilicon 356 is positioned on the transparent conductive oxide 354. The integrated circuit die 320 further includes a first Schottky contact 330a positioned on the second layer of semiconductor material 326, a second Schottky contact 330b positioned on the second layer of semiconductor material 326, and a third Schottky contact 330c positioned on the layer of polysilicon 356. A first anode 332a is positioned on the first Schottky contact 330a. A second anode 332b is positioned on the second Schottky contact 330b. A third anode 332c is positioned on the third Schottky contact 330c. Respective dielectric barriers 334a, 334b are positioned between the layer of polysilicon 356 and the first and second anodes 332a, 332b. An ohmic contact 336 is positioned below the first layer of semiconductor material 324. A cathode 338 is positioned below the ohmic contact 336.

A junction between the second layer of semiconductor material 326 and the first contact 330a is a first Schottky photodiode junction 340a. A junction between the second layer of semiconductor material 326 and the second contact 330b is a second Schottky photodiode junction 340b. A junction between the third contact 330c and the layer of polysilicon 356 is a third Schottky photodiode junction 340c.

In one embodiment, the first layer of semiconductor material 324 is monocrystalline silicon about 300 μm thick. The first layer of semiconductor material 324 is highly doped with N-type dopant atoms, such as phosphorus or arsenic, at a concentration of about $1e19/cm^3$. The second layer of semiconductor material 326 is monocrystalline silicon between about 3 μm and 15 μm thick. Using silicon in this embodiment allows the device to detect radiation in the infrared. It is noted that 4H—SiC is sensitive to the UV range. The second layer of semiconductor material 326 is lightly doped with N-type dopant atoms at a concentration between about $5e13/cm^3$ and $5e14/cm^3$. The dielectric layer 352 is, for example, silicon dioxide between about 100 nm and 300 nm thick. The transparent conductive dielectric 354 is, for example, indium tin oxide (ITO) a between about 50 and 200 nm thick. The layer of polysilicon material 356 is between about 50 nm and 200 nm thick. The polysilicon layer 356 is lightly doped with N-type dopant atoms at a concentration between about $1e13/cm^3$ and $1e14/cm^3$.

In one embodiment, the Schottky contacts 330a-330c are formed of a very thin layer of metal selected to form a Schottky barrier with the second layer of semiconductor material 326 and the layer of polysilicon 356. In one example, the Schottky contacts 330a-330c are a thin layer of Ni about 10-30 nm thick formed on top of respective portions of the second layer of semiconductor material 326 and the layer of polysilicon 356.

In one embodiment, the first, second, and third anodes 332a-332c are formed of a layer of conductive material, such as AlSiCu, about 3 μm thick. The first, second, and third anodes 332a-332c are electrically connected to the respective Schottky contacts 330a-330c on which they are positioned. The first, second, and third anodes 332a-332c are electrically shorted together, thereby forming a single collective anode.

In one embodiment, the dielectric barriers 334a, 334b are $SiO_2$ about 3-6 μm thick. The dielectric barriers 334a, 334b separate the layer of polysilicon 356 from the Schottky contacts 330a, 330b and the anodes 332a, 332b.

In one embodiment, the ohmic contact 336 is a thin layer of conductive material selected to form an ohmic contact with the highly doped first layer of semiconductor material 324.

In one embodiment, the cathode 338 is a highly conductive material, such as a combination layer of titanium, nickel, and gold, positioned on the bottom of the ohmic contact 336. The combination layer may be formed such that all 3 layers are formed by the same equipment, where the titanium is in direct contact with the ohmic contact. The cathode 338 is about 550 nm thick.

The photodiode 322 functions in a similar manner to the photodiode 22 of FIG. 1A. When a low-voltage V0, for example 0 V, is applied between the anodes 332a-332c and the cathode 338 by the power supply 346, depletion regions 342a, 342b in the second layer of semiconductor material 326 do not extend below the Schottky contact 330c. When a high voltage V1, for example −10 V, is applied between the anodes 332a-332c and the cathode 338, the depletion regions 342a, 342b extend below the Schottky contact 330c. At both V0 and V1, the photodiode 322 is sensitive to a first peak wavelength of about 300 nm. However, at V1 the photodiode 322 is further sensitive to a second peak wavelength of about 800 nm. The photodiode 322 is substantially blind (insensitive) to wavelengths between 300 and 800 nm due to the presence of the dielectric layer 352 and the conductive transparent oxide 354. This represents a tremendous improvement over previous photodiodes because both infrared and ultraviolet light can be detected by the photodiode 322 by switching between V0 and V1.

The photodiode 322 can be manufactured by first epitaxially growing the second layer of semiconductor material 326 from the first layer of semiconductor material 324. Next the dielectric layer 352, for example silicon dioxide about 200 nm thick, is deposited on the second layer of semiconductor material 326. A via (not shown) is etched in the dielectric layer 352 exposing the second layer of semiconductor material 326. The transparent conductive oxide 354, about 100 nm thick, is deposited on the dielectric layer 352 and in the via contacting the second layer of semiconductor material 326, which will allow contact of the second layer of semiconductor material to the conductive oxide. A polysilicon layer 356 is then deposited on the transparent conductive oxide. The polysilicon layer 356 is electrically connected to the cathode 338 through the transparent conductive oxide. Subsequent steps to deposit the Schottky contacts 330a-330c, before the anodes 332a-332c, the dielectric barriers 334a, 334b, the ohmic contact 336, and the anodes 338 can be performed in substantially the same manner as similar structures are formed with respect to FIGS. 1F-1K.

Although Schottky contacts and the P-type contacts have been described as being shorted together in the various embodiments, those of skill in the art will recognize that the central Schottky contact, or the central P-type contacts, can be connected to separate voltages from the lateral Schottky contacts or the lateral P-type contacts.

Figure 4:
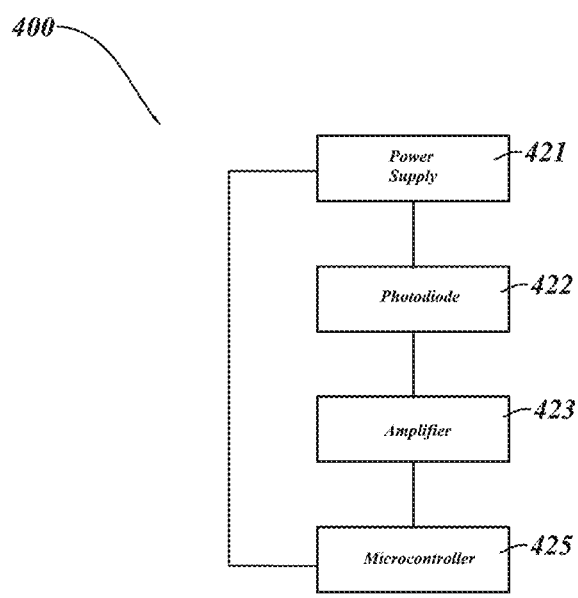
FIG. 4 is a block diagram of a system including a multiband photodiode, according to one embodiment.

FIG. 4 is a block diagram of a system 400. The system 400 includes a power supply 421, a photodiode 422, an amplifier 423, and a microcontroller 425. This power supply 421 provides power to the photodiode 422. According to one embodiment, the power supply first applies a first low-voltage V0, then a high reverse bias voltage V1, to the photodiode 422. The photodiode 422 outputs a photo current to the amplifier 423. When the power supply 421 supplies the low-voltage V0, then the photo current includes only current generated by a first wavelength of light incident on the photodiode 422. When the power supply 421 supplies the higher reverse bias voltage, then the photo current includes current generated from the first peak wavelength of light incident on the photodiode 422 and from a second peak wavelength of light incident on the photodiode 422. The amplifier 423 includes only a single trans-impedance amplifier in an embodiment in which all of the anode terminals are shorted together. The trans-impedance amplifier amplifies the photo current and passes it to the microcontroller 425. The microcontroller 425 measures the photo current at both V0 and V1. The photo current at V0 indicates the intensity of light at the first peak wavelength. The difference between the photo currents at V1 and V0 indicates the intensity of light of the second peak wavelength.

The embodiments described here provide several advantages with respect to the current state of the art. According to principles of the present disclosure, it is possible to more precisely define the lateral extension of a central junction through the lateral confinement structure (deep trenches all around the central junction). In this way the condition of absorption of the photons at low wavelengths does not change at a higher reverse bias value since all the region below the central junction is fully depleted at 0V. Due to the multiplexed anode contact layout, the eventual increase of the current signal produced at higher reverse bias can be attributed exclusively to the absorption of high wavelength photons and not to the increase of the lateral depleted area at the first junction as can happen for example in devices without any lateral confinement of the depletion layer. Furthermore, it is possible to separate the signals arising from the central junction and portion of first epitaxial layer depleted at high reverse bias below the central region through independent anode metallization. In this way the signals coming from the two junctions can be extracted and separated at any time. This concept can be extended to any number of junctions, each one sensitive to a different range of wavelengths. It is also possible to electrically and optically insulate two superimposing junctions through an intermediate buffer layer (dielectric/combination of dielectric layers, or highly doped semiconductor layer) not optically and electrically active, whose nature and thickness can be suitably tailored to make the device sensitive to two not adjacent wavelengths bands (for example in the UV and NIR ranges).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a photodiode, the photodiode including:
   a first layer of semiconductor material;
   a second layer of semiconductor material on the first layer of semiconductor material;
   a first contact on the first layer of semiconductor material;
   a second contact on the second layer of semiconductor material;
   a first photodiode junction at a first interface of the first contact and the first layer of semiconductor material;
   a second photodiode junction at a second interface of the second contact and the second layer of semiconductor material;
   a first electrode electrically coupled to the first layer of semiconductor material; and
   a second electrode electrically coupled to the first and second contacts, in response to a first selected voltage applied between the first and second electrodes the photodiode is sensitive to light in a first wavelength band and substantially insensitive to light in a second wavelength band, and in response to a second selected voltage applied between the first and second electrodes the photodiode is sensitive to light in the second wavelength band.

2. The device of claim 1, further comprising an aperture in the second electrode, the second electrode being positioned on the second contact, the aperture being configured to allow light to pass to a light receiving area of the second layer of semiconductor material directly below the aperture and to pass to a light receiving area of the first layer of semiconductor material directly below the light receiving area of the second layer of semiconductor material.

3. The device of claim 2 wherein a depletion region of the first photodiode junction does not extend to the light receiving area of the first layer of semiconductor material when the first selected voltage is applied between the first and second electrodes, and wherein the depletion region of the first photodiode junction extends to the light receiving area of the first layer of semiconductor material when the second selected voltage is applied between the first and second electrodes.

4. The device of claim 3 wherein the first and second layers of semiconductor material are both of a same first conductivity type, the first layer of semiconductor material having a first concentration of dopant atoms, the second layer of semiconductor material having a second concentration of dopant atoms.

5. The device of claim 4 wherein the first and second contacts are metal and the first and second photodiode junctions are Schottky junctions.

6. The device of claim 4 wherein the first and second contacts are a semiconductor material having a second conductivity type different than the first conductivity type.

7. The device of claim 6 wherein the first and second layers of semiconductor material are doped N and a third layer of semiconductor material is doped P.

8. The device of claim 4, comprising a buffer material positioned between the first and second layers of semiconductor material, wherein the buffer material inhibits light in a third wavelength band between the first and second wavelength bands from passing between the first and second layers of semiconductor material.

9. The device of claim 8 wherein the buffer material is a dielectric material.

10. The device of claim 8 wherein the buffer material is a semiconductor material having the first conductivity type and a dopant atom concentration between the first and second concentrations of dopant atoms.

11. The device of claim 1 wherein the photodiode has a substantially constant sensitivity to light in the first wavelength band when the first or the second selected voltage is applied between the first and second electrodes.

12. The device of claim 1 wherein the first electrode is positioned below the first and second layers of semiconductor material.

13. The device of claim 1 wherein the first and second layers of semiconductor material are monocrystalline, the second layer of semiconductor material being epitaxially grown from the first layer of semiconductor material.

14. The device of claim 13 wherein the first and second contact are coupled together and are formed of the same material.

* * * * *